United States Patent [19]

Krivokapic et al.

[11] Patent Number: 5,966,527

[45] Date of Patent: Oct. 12, 1999

[54] APPARATUS, ARTICLE OF MANUFACTURE, METHOD AND SYSTEM FOR SIMULATING A MASS-PRODUCED SEMICONDUCTOR DEVICE BEHAVIOR

[75] Inventors: Zoran Krivokapic, Santa Clara; William D. Heavlin, San Francisco, both of Calif.

[73] Assignee: Advanced Micro Devices, Inc., Sunnyvale, Calif.

[21] Appl. No.: 08/738,542

[22] Filed: Oct. 28, 1996

[51] Int. Cl.$^6$ .............................. G06F 9/455; G06F 17/50
[52] U.S. Cl. ......................................................... 395/500.35
[58] Field of Search ............................ 395/500; 364/578, 364/488–491

[56] References Cited

U.S. PATENT DOCUMENTS

| | | |
|---|---|---|
| 4,901,242 | 2/1990 | Kotan . |
| 5,111,404 | 5/1992 | Kotani . |
| 5,260,865 | 11/1993 | Beauford et al. . |
| 5,301,118 | 4/1994 | Heck et al. . |
| 5,319,564 | 6/1994 | Smayling et al. . |
| 5,341,302 | 8/1994 | Conners et al. . |
| 5,402,367 | 3/1995 | Sullivan et al. . |
| 5,438,527 | 8/1995 | Feldbaumer et al. . |
| 5,495,417 | 2/1996 | Fuduka et al. . |
| 5,502,643 | 3/1996 | Fujinaga ................................ 364/488 |
| 5,629,877 | 5/1997 | Tamegaya et al. ..................... 364/578 |
| 5,646,870 | 7/1997 | Krivokapic ............................. 364/578 |

OTHER PUBLICATIONS

Boning, et al., "DOE/OPT: A System for Design of Experiments, Response Surface Modeling & Optimization Using Process & Device Simulation," IEEE Trans on Semiconductor Mfg., vol. 7, Iss. 2, May 1994, pp. 233–244.

Boskin, et al., "A Method for Modeling the Manufacturability of IC Designs," Proc IEEE Int. Conf. On Microelectronics Test Structures, vol. 6, Mar. 1993, p. 241–24.

Dance, et al., "Appl. of yield models for semiconductor yield improvement," Defect & Fault Tolerance on VLSI Systems, 1992 pp. 257–266.

Dill, et al., "Modeling Positive Photoresist," Proceedings of the Kodak Microelectronics Seminar, Oct. 1974, pp. 24–31.

Duvall, "Towards a Practical Methodology for the Statistical Design of Complex IC Products," 1993 VLSI TSA, pp. 112–116.

(List continued on next page.)

*Primary Examiner*—Kevin J. Teska
*Assistant Examiner*—Ayni Mohamed
*Attorney, Agent, or Firm*—Fliesler, Dubb, Meyer & Lovejoy LLP

[57] ABSTRACT

A design apparatus, article of manufacture, method and system are disclosed for simulating mass-produced semiconductor device behavior. Drain-to-source current values are obtained from actual semiconductor devices in response to voltage levels at the drain-to-source and gate of a semiconductor device. Semiconductor device attributes, such as channel-length doping concentration are also measured. A device simulator and process simulator are calibrated based upon the actual drain-to-source current values and measured attributes. A process simulator is run in response to simulated process parameters to obtain a plurality of simulated mass-produced semiconductor devices having varying semiconductor attributes. A device simulator is then run using the plurality of simulated mass-produced devices to obtain a plurality of I/V curves based upon the plurality of simulated semiconductor devices. Worst-case I/V curves are then obtained from the plurality of I/V curves by analyzing drain-to-current values in the plurality of I/V curves associated with a predetermined voltage value. Parameters then may be extracted from the worst-case I/V curves in order to determine accurate worst-case semiconductor device designs. Manufacturing guard bands may then also be identified based upon the worst-case I/V curves and idealized I/V curves.

37 Claims, 11 Drawing Sheets

OTHER PUBLICATIONS

Heavlin, W.D. and Finnegan, G.P., "Dual Space Algorithms for Designing Space–filling Experiments," *Interface 1994*, Research Triangle, North Carolina, Jun. 1994, pp. 41–47.

Heavlin, "Variance Components & Computer Experiments," Proc 1994 Amer. Statistical Assoc., pp. 103–108.

Huang, J.H, et al."BSIM3 Manual, version 2.0", Department of Electrical Engineering and Computer Science, University of California, Berkeley, CA, 1994 (218 pages).

Iravani, et al., "Statistical Modeling Tools, Methods & Applications for IC Mfg." Proc IEEE '95 Conf on Microelectronic Test Structures, vol. 8 Mar. 1995, pp. 203–207.

Kaplan, S. and Karklin, L., "Calibration of Lithography Simulator by Using Sub–Resolution Patterns," *Proceedings on Optical/Laser Microlithography VI*, SPIE 1927, pp. 858–867, 1993.

Kizilyalli, et al., "Predictive Worst Case Statistical Modeling of 0.8 $\mu$m BICMOS Bipolar Transistors: A Methodology Based on Process & Mixed Device/Circuit Level Simulators," IEEE Trans. On Electron Devices, vol. 40, No. 5, May 1993, pp. 966–973.

Krivokapic, Z. and Heavlin, W. D., "Predicting Manufacturing Variabilities for Deep Micron Technologies: Integration of Process, Device, and Statistical Simulations," in *Simulation of Semiconductor Devices and Processes, 5*, S Selberherr, H Stippel and E Strasser, eds, pp. 229–232, Springer–Verlag, New York, 1993.

Lopez–Serrano, et al., "Yield Enhancement Prediction with Statistical Process Simulations in an Advanced Poly–emitter Complementary Bipolar Technology," IEEE 1994 Custom IC Cont., pp. 13.1.1(289)–13.1.4(292).

Mack, "Development of Positive Photoresists," Jour. Electro. Chem. Soc: Solid State Sci. & Tech., vol. 134 Issue 1, Jan. 1987, pp. 148–152, Jan. 1987.

Mack, C. and Charrier, E., "Yield Modeling for Photolithography," *Proceedings of OCG Microlithography Seminar*, pp. 171–182, 1994.

Mandel, "The Statistical Analysis of Experimental Data," John Wiley & Sons, 1964, Chap. 12, pp. 272–311.

Neureuther, et al., "Photoresist Modeling & Device Fabrication Appl.," Optical & Acoustical Microelectronics, 1974, pp. 223–249.

Niu, et al., "A Bayesian Approach to Variable Screening for Modeling the IC Fabrication Process," Circuits & Systems, 1995 IEEE Int'l Symposium, pp. 1227–1230.

Owen, "Controlling Correlations in Latin Hypercube Samples," 1994 Jour. Amer. Statistical Assoc., vol. 89 No. 428, Dec. 1994, pp. 1517–1522.

Pinto, et al., "ULSI Tech. Dev. by Predictive Simulation," 1933 IEEE, pp. 29.1.1–29.1.4.

Rietman, et al., Process Models & Network Complexity, 1993 Int'l. Conf. On Neural Networks, pp. 1265–1269.

Ripley, B.D., *Spatial Statistics*, pp. 44–74, Wiley, New York, 1981.

Smith, et al., "Comparison of scalar & vector diffraction modeling for deep–UV lithography," SPIE vol. 1927 Optical/Laser Microlithography VI—1993, pp. 847–857.

Stein, "Large Sample Properties of Simulations Using Latin Hypercube Sampling," Technometrics, vol. 29 Iss. 2, May 1987, pp. 143–151.

Welten, et al., "Statistical Worst–Case Simulation for CMOS Technology," IEEE Colloq. No. 153: Improving the Efficiency of IC Mfg. Technology, 1995 (3 pages).

Williams, et al., "Application of Process Statistics to Macro/Behavioral Modeling" IEEE 1993, pp. 515–518.

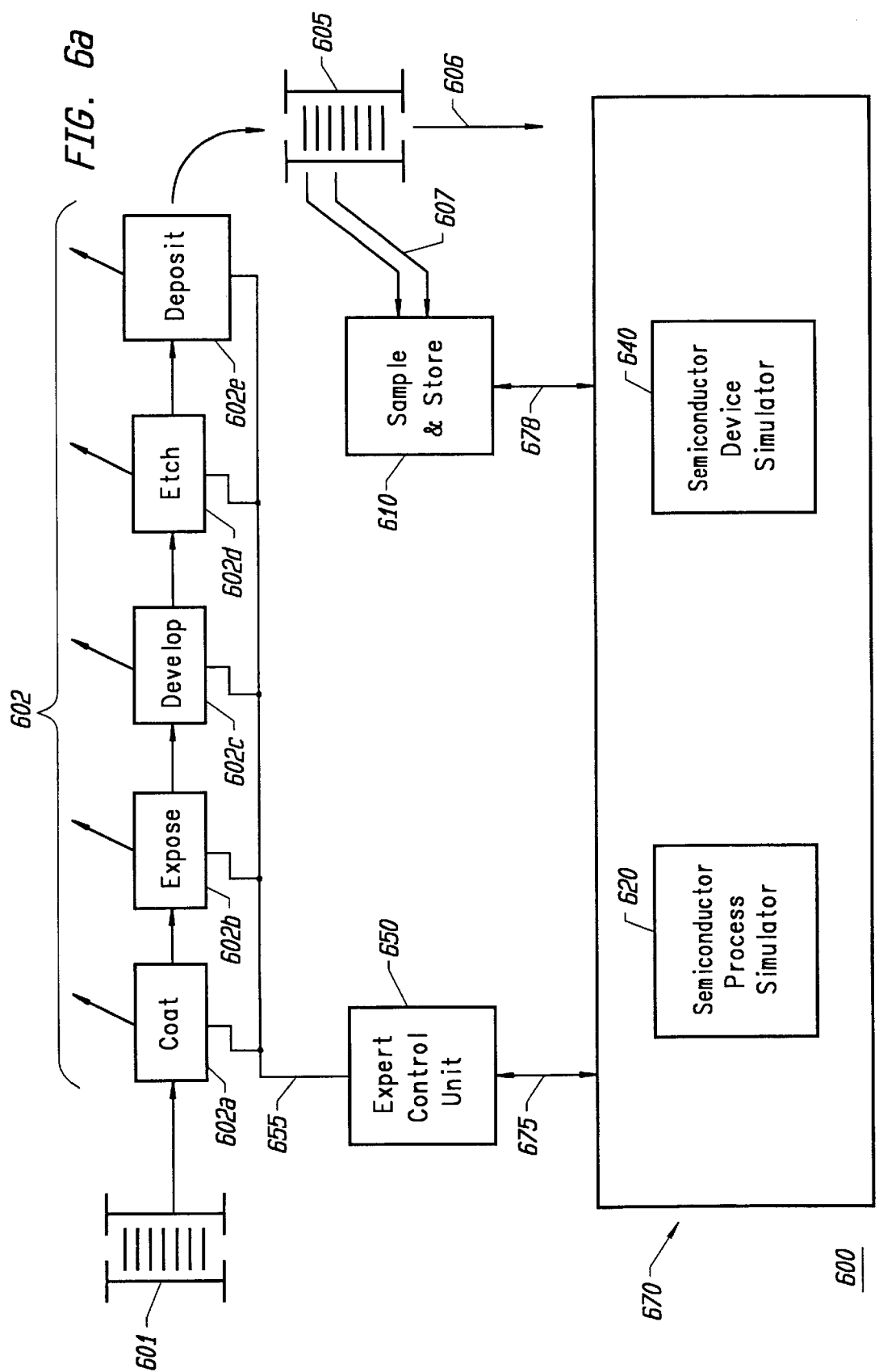

APPARATUS, ARTICLE OF MANUFACTURE, METHOD AND SYSTEM FOR SIMULATING A MASS-PRODUCED SEMICONDUCTOR DEVICE BEHAVIOR

BACKGROUND OF THE INVENTION

1. Field of the Invention

The invention is directed toward designing and manufacturing semiconductor devices, such as Field Effect Transistors ("FET"). In particular, the invention is directed toward modeling or simulating a semiconductor device manufactured under typical mass-produced conditions.

2a. Cross-reference to Related Applications

The following copending U.S. patent application is assigned to the assignee of the present application, is related to the present application and its disclosures are incorporated herein by reference:

(A) Ser. No. 08/388,016 filed Feb. 13, 1995 by Zoran Krivokapic, William D. Heavlin and David F. Kyser and entitled METHOD FOR SETTING AND ADJUSTING PROCESS PARAMETERS TO MAINTAIN ACCEPTABLE CRITICAL DIMENSIONS ACROSS EACH DIE OF MASS-PRODUCED SEMICONDUCTOR WAFERS.

2b. Cross-reference to Related Documents

The following publications are believed relevant to the below discussion and are incorporated herein by reference:

(a) S. Kaplan and L. Karklin, "Calibration of Lithography Simulator by Using Substitute Patterns," *Proceedings on Optical/Laser Microlithography VI,* SPIE 1927, pp847–858, 1993.

(b) C. Mack and E. Charrier, "Yield Modeling for Photolithography," *Proceedings of OCG Microlithography Seminar,* pp 171–182, 1994.

(c) TMA DEPICT, *Two-Dimensional Process Simulation Program for Deposition, Etching, and Photolithography, version* 3.0, Technology Modeling Associates, Inc., Palo Alto, Calif., 1993.

(d) Mandel, J, *The Statistical Analysis of Experimental Data.* Wiley, New York, 1964

(e) Z. Krivokapic and W. D. Heavlin, "Predicting Manufacturing Variabilities for Deep micron Technologies: Integration of Process, Device, and Statistical Simulations," in *Simulation of Semiconductor Devices and Processes,* 5, S Selberherr, H Stippel and E Strasser, eds, pp 229–232, Springer-Verlag, New York, 1993.

(f) W. D. Heavlin and G. P. Finnegan, "Dual Space Algorithms for Designing Space-filling Experiments," *Interface* 1994, Research Triangle, North Carolina, June 1994.

(g) B. D. Ripley, *Spatial Statistics,* pp 44–75, Wiley, New York, 1981.

(h) A. B. Owen, "Controlling Correlations in Latin Hypercube Samples," *Journal of the American Statistical Association,* vol 89, no. 428, pp 1517–1522, December 1994.

(i) W. D. Heavlin, "Variance Components and Computer Experiments," 1994 *ASA Proceedings, section on Physical and Engineering Sciences,* Toronto, August 1994.

(j) A. R. Neureuther and F. H. Dill, "Photoresist Modeling and Device Fabrication Applications," *Optical and Acoustical Microelectronics,* pp 223–247, Polytechnic Press, New York, 1974.

(k) F. H. Dill, J. A. Tuttle, A. R. Neureuther, "Modeling Positive Photoresist," *Proceedings, Kodak Microelectronics Seminar,* pp 24–31, 1974.

(l) C. Mac, "Development of Positive Photoresists," *Journal of the Electrochemical Society,* vol 134, January 1987.

(m) M. Stein, "Large Sample Properties of Simulations using Latin Hypercube Sampling," *Technometrics,* vol 29, no 2, pp 143–151, May 1987.

(n) M. D. McKay and R. J. Beckman, "Using Variance to Identify Important Inputs," 1994 *ASA Proceedings, Section on Physical and Engineering Sciences,* Toronto, August 1994.

(o) J. H. Juang, Z. H. Liu, M. C. Jeng, K. Hui, M. Chan, P. K. Ko and C. Hu, "BSIM3 Manual, version 2.0", *Department of Electrical Engineering and Computer Science, University of California,* Berkeley, Calif., 1994.

DESCRIPTION OF THE RELATED ART

An integrated circuit ("IC") designer must consider numerous transistor attributes, such as channel length and doping concentration, in modeling or predicting semiconductor behavior or operation. Often, an IC designer must balance conflicting transistor attributes in achieving desired semiconductor behavior, such as a specified drain-to-source current vs. drain-to-source voltage curve ("I/V curve"). For example, in order to improve transistor speed, an IC designer may increase current drive and thus speed up the charge and discharge of capacitive loads. This generally requires shorter channel lengths and a thin gate oxide thickness. Similarly, an IC designer may desire to shorten channel lengths to minimize the size of the semiconductor device. However, shorter channel lengths may cause threshold voltage to drop, among other problems, all of which lead to undesirable higher leakage current.

Various semiconductor device simulators have been built to model designed transistor behavior. Device simulators, such as PISCES and MINIMOS have been developed to emulate semiconductor behavior based upon specified transistor attributes, such as doping concentration, channel length, gate oxide thickness, junction depth and so on.

FIG. 1 illustrates a prior art method for modeling, in particular to obtain I/V curves, for a transistor having specified attributes as illustrated in FIG. 2. FIG. 2 illustrates an n-channel metal oxide semiconductor ("NMOS") device 200 formed on substrate 201. NMOS device 200 may be part of a complementary metal oxide semiconductor ("CMOS") device. Device 200 includes, among other specified transistor attributes, a specified channel length L, doping concentration N+ in a respective source and drain, and gate oxide thickness T. Only a few of the numerous transistor attributes typically found in a semiconductor device are illustrated in FIG. 2.

Before an accurate model of semiconductor device 200 may be obtained, certain "parameters" must be extracted from semiconductor device 200, as illustrated in FIG. 1. Typically, a device simulator requires specific device "parameters" in order to provide a simulation. For example, one semiconductor device simulator requires five specific sets of parameters, as illustrated by parameters 103–107. Some of the parameters are extracted from device parameter extractor 102. Some of these parameters may correspond to physical measurements of transistor device 200, such as channel length L and doping concentration N+, while other parameters may be based on or derived from these physical measurements or other parameters.

Device parameter extractor 102 may include a personal computer and a signal analyzer coupled to a probe station for measuring signals from transistor 200. The signals may include drain-to-source current, $I_{DS}$, drain-to-source voltage $V_{DS}$ and gate voltage $V_G$ measurements. Parameters associated with a single semiconductor device 200 or multiple semiconductor devices 200 having varying attributes, such as a shorter channel length and higher doping concentration, may be extracted by device parameter extractor 102.

The five sets of parameters 103–107 illustrate parameters associated with a particular semiconductor device, for example, a CMOS device. Parameters 105, shown as $y_1$ TT, $y_2$ TT . . . , represent parameters associated with a typically nominal target-manufactured CMOS device having predetermined attributes and assuming minimum process variations. Parameters 103, shown as $y_1$ FF, $y_2$ FF, . . . , represent parameters associated with a CMOS device which is manufactured under process conditions which result in a CMOS device which operates at switching speed extremes. In other words, the CMOS device attributes are manufactured under conditions which create a fast NMOS device and fast PMOS device. Parameters 103 are derived from parameter 105. Parameters 104, shown as $y_1$ FS, $y_2$ FS . . . , illustrate parameters associated with a CMOS device where the NMOS device is manufactured under process conditions which enable maximum switching speeds while the PMOS device operates at minimum operating switching speeds. Parameters 104 are also derived from parameter 105. Likewise, parameters 106, shown as $y_1$ SF, $y_2$ SF . . . , refer to a manufactured CMOS device in which the NMOS device operates at a minimum switching speed and the PMOS device is manufactured under conditions which enable operations at a maximum switching speed. Finally, parameters 107, shown as $y_1$ SS, $y_2$ SS . . . , refer to a manufactured CMOS device in which both the NMOS device and PMOS device are manufactured under conditions which create minimum switching speeds for both devices. These five process parameters 103–107 are also referred to as the "five corners" or illustrate the operational or behaviorally envelope for a typical manufactured CMOS device. The five corners are shown by reference numeral 110. Based on these measured and derived parameters 103–107, designers can model, with a semiconductor simulator, the I/V curve 109 of a semiconductor device. In particular, the designer can determine worst-case I/V curves 109a–b and how worst case transistors affect a circuit.

The prior art method described above suffers from many disadvantages in accurately modeling a transistor. First, because the parameters 103–107 do not accurately reflect mass-produced semiconductor devices under typical process conditions, the I/V curve 109 and five corners 110 do not reflect realistic worst-case I/V curves and device operating envelopes, respectively. Specifically, parameter 103, representing a fast PMOS device and fast NMOS device, does not accurately represent a mass-produced CMOS semiconductor device. For example, the doping concentrations necessary to create a CMOS semiconductor device corresponding to these parameters would rarely, if at all, be encountered in a mass production line. Likewise, parameters 107 do not accurately reflect the worst-case slow NMOS device and slow PMOS device typically manufactured in a production line. Thus, the I/V curves 109a–b and five corners 110 do not accurately represent the worst-case semiconductor devices manufactured on a typical mass-production line. A designer is typically factoring in unnecessary manufacturing tolerances, or bands, in designing a semiconductor device based upon exaggerated worst-case curves. Unnecessary spacing may be designed into semiconductor components, creating slower and larger devices than could otherwise be manufactured.

Second, prior methods of modeling semiconductor devices do use semiconductor manufacturing process simulations generating distributions of manufactured semiconductor devices, thereby improving the accuracy of a semiconductor simulator. Specifically, prior methods used parameters derived from a single or few semiconductor devices. These parameters do not accurately reflect the enormous variations in semiconductor manufacturing process steps and how these variations affect a mass-produced semiconductor device behavior. For example, the prior method does not consider how manufacturing variations in forming oxidation layers or channel lengths affect modeled semiconductor devices.

Third, the prior method generally does not improve as further information regarding the manufacturing of the mass-produced semiconductor device is obtained. Specifically, only a relatively small number of values in parameters 105 are measured and used to derive parameters 103, 104, 106 and 107. Thus, greater information regarding the semiconductor device manufacturing process does not improve semiconductor simulation results. The prior method does not generate an improved semiconductor device model if improved information regarding the distribution of mass-produced semiconductor devices from a modeled production line is known. In this sense, the prior method is not scalable.

SUMMARY OF THE INVENTION

The invention provides an apparatus, article of manufacture and method for modeling mass-produced semiconductor devices and a system for manufacturing such devices.

I/V curves obtained from the modeling are used to show how choice of semiconductor device attributes, such as channel length, effect the "guard band" or manufacturability of such devices.

In brief, the invention may be characterized as including at least the following features: (1) an interactive computer design system for designing circuits in view of discovered worst-case I/V curves of mass-produced semiconductor devices; (2) an article of manufacture, including a software program, for modeling I/V curves for mass-produced semiconductor devices; (3) a method for predicting I/V curves for mass-produced semiconductor devices; and, (4) a wafer fabrication and line monitoring and correction system.

In accordance with the an aspect of the present invention, a design apparatus for modeling a mass-produced semiconductor device is disclosed. A display for displaying data to a user and input means for supplying input data in response to a user's input is provided. Memory for storing a computer software program is coupled to the display and input means. A processor, the input means and the memory are coupled to the display for controlling memory and performing processing operations. The stored software program includes means for providing a plurality of simulated mass-produced semiconductor devices responsive to a plurality of process parameters, wherein the plurality of simulated semiconductor devices have associated attributes. The stored software program also includes means for providing a plurality of semiconductor device behaviors responsive to the plurality of simulated mass-produced semiconductor devices and means for obtaining a worst-case semiconductor device behavior responsive to the plurality of semiconductor behaviors.

In accordance with another aspect of the present invention, an article of manufacture, including a computer readable medium having a computer readable program code means for modeling a mass-produced semiconductor device is provided. The article of manufacture includes a computer readable program code means for simulating a plurality of mass-produced semiconductor devices responsive to a plurality of process parameters. The article of manufacture also includes a computer readable program code means for calibrating the computer readable means for simulating a plurality of mass-produced semiconductors in response to actual semiconductor device attributes. Also, computer readable program code means for simulating a plurality of semiconductor device I/V curves in response to the semiconductor device attributes of the respective plurality of simulated mass-produced semiconductor devices is provided. The article of manufacture further includes a computer readable program code means for calibrating the means for simulating a plurality of semiconductor device I/V curves and obtaining worst-case I/V curves in the plurality of semiconductor device I/V curves.

In another aspect of the present invention, a method is provided for predicting drain-to-source current versus drain-to-source voltage curves for a mass-produced semiconductor device, having a channel length and/or other fabrication-defined attributes. The method comprises the steps of simulating the process of manufacturing the mass-produced semiconductor device, responsive to a plurality of process parameters, to obtain a plurality of simulated semiconductor devices having associated fabrication-defined attributes. A plurality of semiconductor drain-to-source current versus drain-to-source voltage curves are then simulated in response to associated fabrication defined attributes. Worst-case drain-to-source current versus drain-to-source voltage curves are then obtained based on the plurality of simulated semiconductor drain-to-source current versus drain-to-source voltage curves.

Other aspects and advantages of the present invention can be seen upon review of the figures, the detailed description, and the claims which follow.

BRIEF DESCRIPTION OF THE DRAWINGS

FIGS. 6a–c illustrate a wafer fabrication monitoring and correction system according to the present invention.

DETAILED DESCRIPTION OF THE INVENTION

Figure 1:
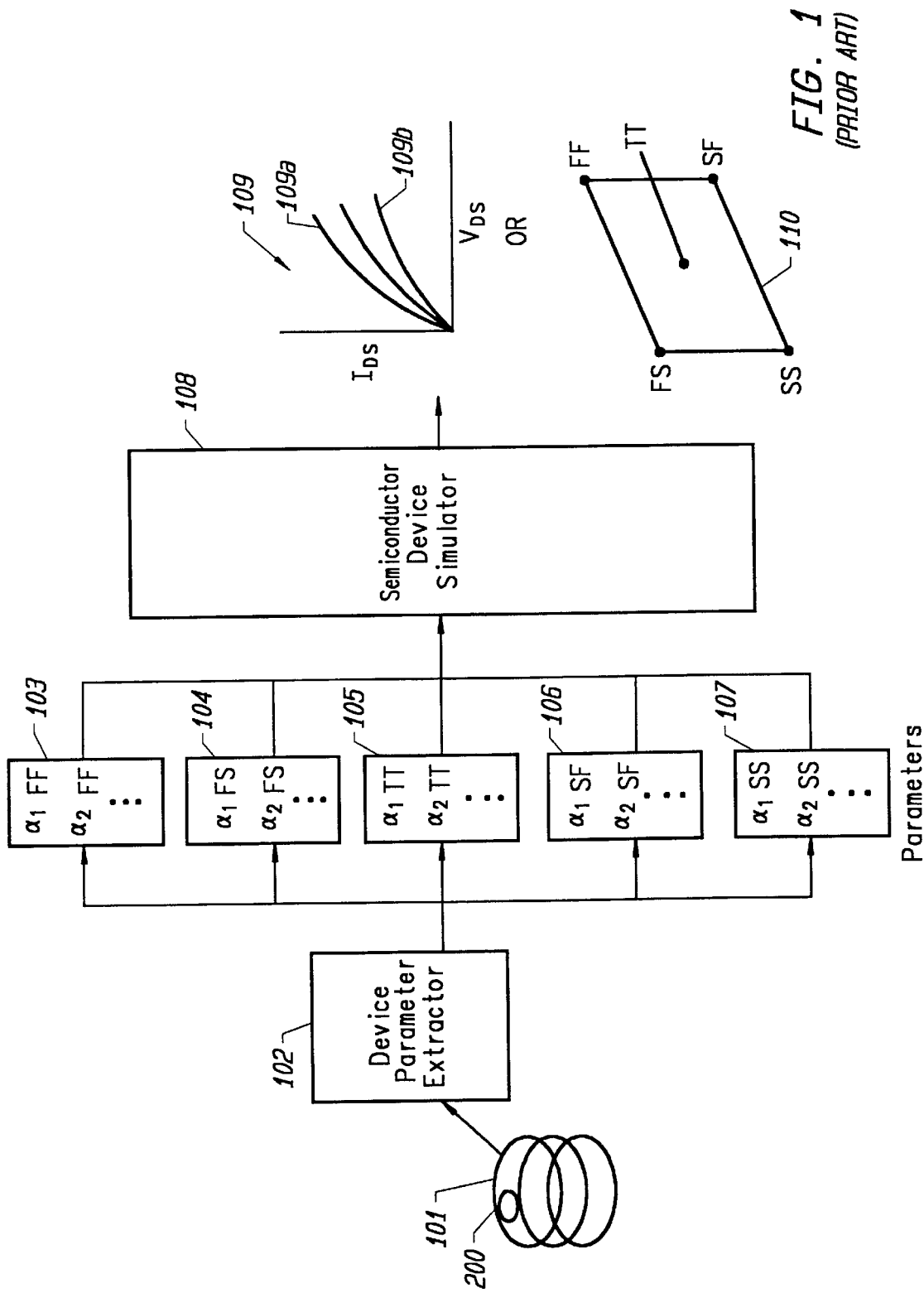
FIG. 1 illustrates a prior method for modeling semiconductor behavior for a specified semiconductor device.
Figure 2:
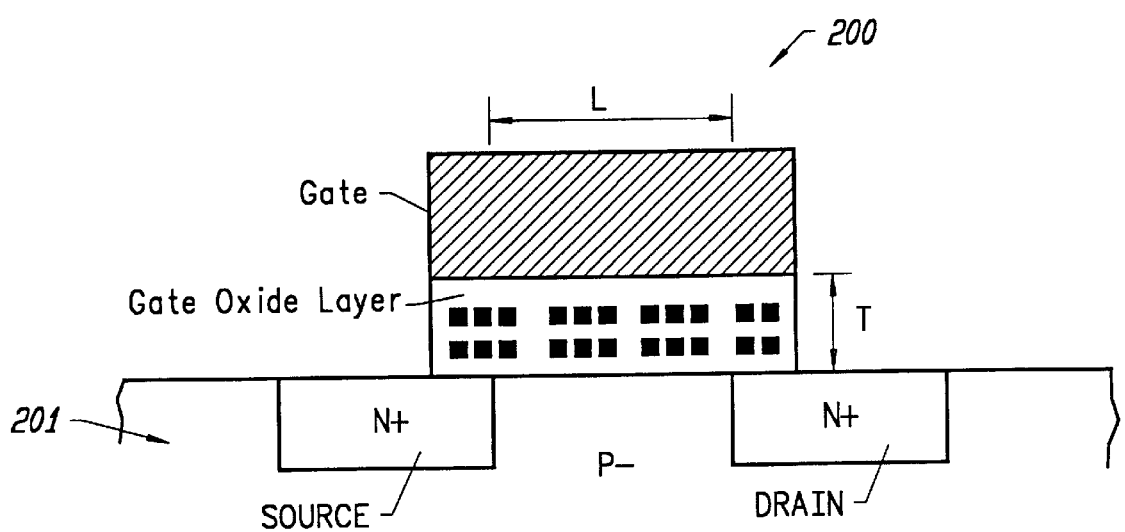
FIG. 2 illustrates a typical NMOS semiconductor device.
Figure 3:
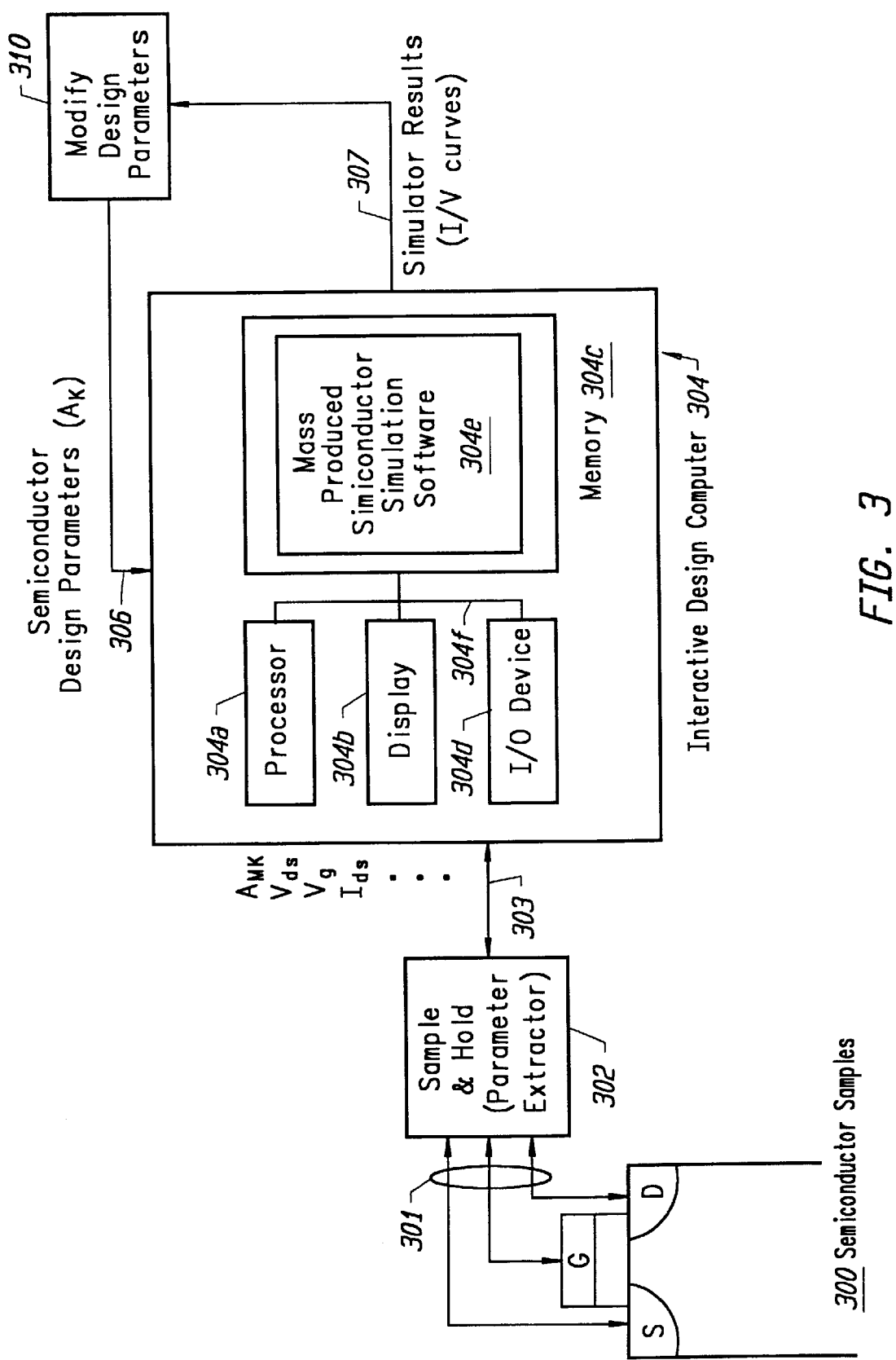
FIG. 3 illustrates an apparatus, such as an interactive design computer, for modeling semiconductor behavior for a specified mass-produced semiconductor device according to the present invention.

I. Interactive Design Apparatus for Predicting I/V Curves of Mass-Produced Semiconductor Devices FIG. 3 illustrates an interactive design apparatus for designing circuits in view of discovered I/V curves of simulated mass-produced semiconductors. Voltage and current values are obtained from semiconductor device samples 300 by leads 301 which are connected to sample & hold device 302. These voltage and current values may be drain-to-source voltage $V_{DS}$ values and/or gate voltage $V_G$ values, along with drain-to-source current values $I_{DS}$. In an embodiment, sample & hold device 302 may include a parameter extractor. The parameter extractor may include a computer and signal analyzer connected to a probe station for measuring signals from semiconductor device samples 300. The computer may also include parameter extractor software. In an alternate embodiment, sample & hold may be incorporated into interactive design computer 304. The signal values obtained from sample & hold device 302 then may be transferred on bus 303 to interactive design computer 304. In an embodiment, signal values transferred on bus 303 may be entered manually into computer 304. Semiconductor attributes $A_{MK}$, such as channel length, gate oxide thickness, doping concentration and so on may also be entered manually or transferred on bus 303. Design computer 304 may also control the sampling of current and voltage values by sample & hold device 302 by sending command signals on bus 303.

In an embodiment, design computer 304 includes processor 304a, display 304b, I/O device 304d and memory 304c. Processor 304a, display 304b and I/O device 304d are coupled by internal bus 304f. Memory 304c may include mass-produced semiconductor simulation software program 304e. While FIG. 3 illustrates design computer 304c having a single processor, it should be understood that the present invention could be used in a multiple or distributed processor environment. Generally, processor 304a interacts with mass-produced semiconductor simulation software 304e in memory 304c to display I/V curves on display 304b in response to voltage and current values over bus 303, as well as semiconductor design attribute values $A_K$ (channel length, doping concentration and so on). I/O device 304d, such as a mouse, glide pad and/or keyboard, may be used to input data and selections to design computer 304.

I/V curves or simulation results may be output as illustrated by line 307. These results may be output to another computer/network or displayed on display 304b. Semiconductor device attributes $A_K$ then may be modified based upon the simulation results, as illustrated by logic block 310. In an embodiment, a user may modify semiconductor attributes by inputting new design attributes $A_K$, by way of I/O device 304d, into interactive design computer 304, as illustrated by arrow 306. Based upon the simulation results, a user may analyze the various worst-case I/V curves in a mass-produced semiconductor device based upon specific design attributes $A_K$. Moreover, a user may adjust certain design attributes in order to meet manufacturing tolerance guards or design specifications.

Figure 4:
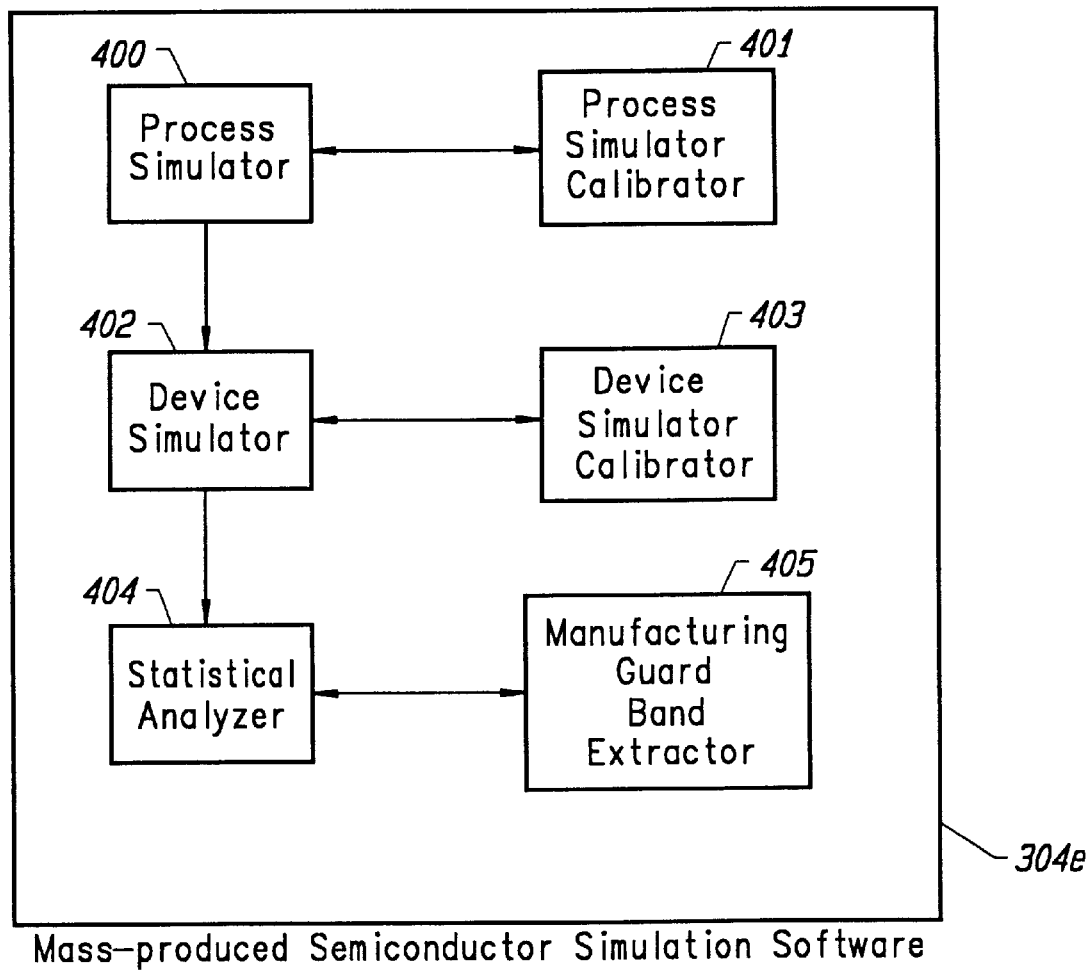
FIG. 4 illustrates software modules of the mass-produced semiconductor simulation software 304e shown in FIG. 3.

FIG. 4 illustrates the software modules used in the mass-produced semiconductor simulation software 304e illustrated in FIG. 3. Among the various software modules, mass-produced semiconductor simulation software 304e includes a process simulator 400 for simulating the manufacture of multiple semiconductor devices based on process parameter inputs. For example, process simulator 400 will output various simulated semiconductor devices having different attributes, such as varying channel lengths, depending upon inputted process parameters. An example of a process simulator is a DEPICT™ simulator, available from Technology Modeling Associates of Palo Alto, Calif.

As is known in the art, process simulator calibrator 401 calibrates process simulator 400 results based upon actual semiconductor device attribute measurements $A_{MK}$ from a sampled semiconductor manufactured on a production line.

Similarly, device simulator 402 outputs semiconductor device behavior, in particular drain-to-source current versus drain-to-source voltage curves, based upon inputted semiconductor device attributes, such as channel length, doping concentration, gate oxide thickness, and so on. An example of a device simulator is a BSIM3 device simulator, available from the Department of Electrical Engineering and Computer Science, University of California, Berkeley, Calif. 94770. In the BSIM3 device simulator, simulator parameters must be input into the device simulator. These parameters are divided into several categories. The first set of parameters, as illustrated by Table A, are obtained from measured semiconductor devices. The second set of parameters, as illustrated by Table B, are temperature effect parameters which are also extracted from measured semiconductor devices. Finally, elementary parameters and model flags, as illustrated in Table C, are input into the BSIM3 simulator, and are not obtained from measured semiconductor devices. As can be seen from the tables, default values may be entered if data is not available.

TABLE A

Drain Current Model Parameters Extracted from Measured Data

| Parameter | Description | Default | Unit |
|---|---|---|---|
| vth0 | Threshold voltage @ $Vh_{bs}$ - 0 for large L | * | V |
| k1 | First-order body effect coefficient | * | $V^{1/2}$ |
| k2 | Second-order body effect coefficient | * | — |
| k3 | Narrow width coefficient | 80.0 | — |
| w0 | Narrow width parameter | 2.5E-6 | m |
| nlx | Lateral non-uniform doping coefficient | 1.74E-7 | m |
| dvt0 | First coefficient of short-channel effect on $V_{th}$ | 2.2 | — |
| dvt1 | Second coeff. of short-channel effect on $V_{th}$ | 0.53 | — |
| dvt2 | Body-bias coeff. of short-channel effect on $V_{th}$ | -0.032 | 1/V |
| d1 | channel-length reduction on one side | 0 | m |
| dw | channel width reduction on one side | 0 | m |
| ua | First-order mobility degradation coeff. | 2.25E-9 | m/V |
| ub | Second-order mobility degradation coeff. | 5.87E-19 | $(m/V)^2$ |
| uc | Body-effect of mobility degradation coeff. | 0.0465 | 1/V |
| vsat | Saturation velocity at Temp = Tnom | 8.0E6 | cm/sec |
| a0 | Bulk charge effect coefficient | | |
| | NMOS | 1.0 | |
| | PMOS | 4.4 | |
| keta | Body-bias coeff. of the bulk charge effect | -0.07 | 1/V |
| a1 | First non-saturation factor | | |
| | NMOS | 0 | 1/V |
| | PMOS | 0.23 | |
| a2 | Second non-saturation factor | | |
| | NMOS | 1.0 | — |
| | PMOS | 0.08 | |
| rds0 | Contact resistance | 0 | Ω |
| rdsw | Parasitic resistance per unit width | 0 | Ω.μm |
| voff | Offset voltage in the subthreshold region | -0.11 | V |
| nfactor | Subthreshold swing coeff. | 1.0 | — |
| cdsc | Drain/Source and channel coupling cap. | 2.4E-4 | $F/m^2$ |
| eta0 | DIBL coefficient in subthreshold region | 0.08 | — |
| etab | Body-bias coeff. for the subthreshold DIBL effect | -0.07 | 1/V |
| dsub | DIBL coefficient in subthreshold region | drout | — |
| pclm | Channel length modulation coeff. | 1.3 | — |
| pdibl1 | First output resistance DIBL effect coeff. | 0.39 | — |
| pdibl2 | Second output resistance DIBL effect coeff. | 0.0086 | — |
| drout | L depend. coeff. of the DIBL effect in $R_{out}$ | 0.56 | — |
| pscbe1 | First substrate current body-effect coeff. | 4.24E8 | V/m |
| pscbe2 | Second substrate current body-effect coeff. | 1.0E-5 | V/m |

TABLE B

Temperature Effect Coefficients

| Parameter | Description | Default | Unit |
|---|---|---|---|
| Tnom | Temp. at which parameters are extracted | 27 | °C. |
| ute | Mobility temperature exponent | -1.5 | — |
| kt1 | Temperature coeff. for threshold voltage | -0.11 | V |
| kt11 | Channel length sensitivity of temperature coeff. for threshold voltage | 0 | Vm |
| kt2 | Body-bias coeff. of the $V_{th}$ temperature effect | 0.022 | — |
| ua1 | Temperature coeff. for ua | 4.31E-9 | m/V |
| ub1 | Temperature coeff. for ub | -7.61E-18 | $(m/V)^2$ |
| uc1 | Temperature coeff. for uc | -0.056 | 1/V |
| uc( ) | Temperature coeff. | * | $(V/m)^2$ |
| at | Temperature coeff. for saturation velocity | 3.3E4 | m/sec |

TABLE C

Elementary Parameters

| Parameter | Description | Default | Unit |
|---|---|---|---|
| tox | Gate oxide thickness | 1.50E-8 | m |
| xj | Junction Depth | 1.50E-7 | m |
| npeak | Peak doping concentration near the interface | 1.7E17 | $1/cm^3$ |
| nsub | Substrate doping concentration | 6.0E16 | $1/cm^3$ |
| subthMod | Subthreshold model selector | 2 | — |
| satMod | Saturation model selector | 2 | — |
| bulkMod | Bulk charge model selector | 1 | — |
| xpart | Charge partitioning flag | 1 | — |

As with the process simulator calibrator software module 401, device simulator calibrator 403 calibrates device simulator behavior outputs from device simulator 402 based upon measured I/V curves of sampled semiconductor devices.

Statistical analyzer 404 is then used to create worst-case I/V curves using drain-to-source current values in the multiple I/V curves associated with the multiple simulated devices output from device simulator 402. Conditional distributions of current values for a specific voltage are obtained. In particular, drain-to-source current values are averaged and a standard deviation is obtained for predetermined drain-to-source voltage values. In another embodiment, smallest (or 2nd smallest) and largest (or 2nd largest) current maximums could be used for statistical guard bands.

Finally, manufacturing guard band extractor 405 is used to identify the guard bands between ideal semiconductor device I/V curves or behavior and worst-case I/V curves from statistical analyzer 404.

Figure 5A:
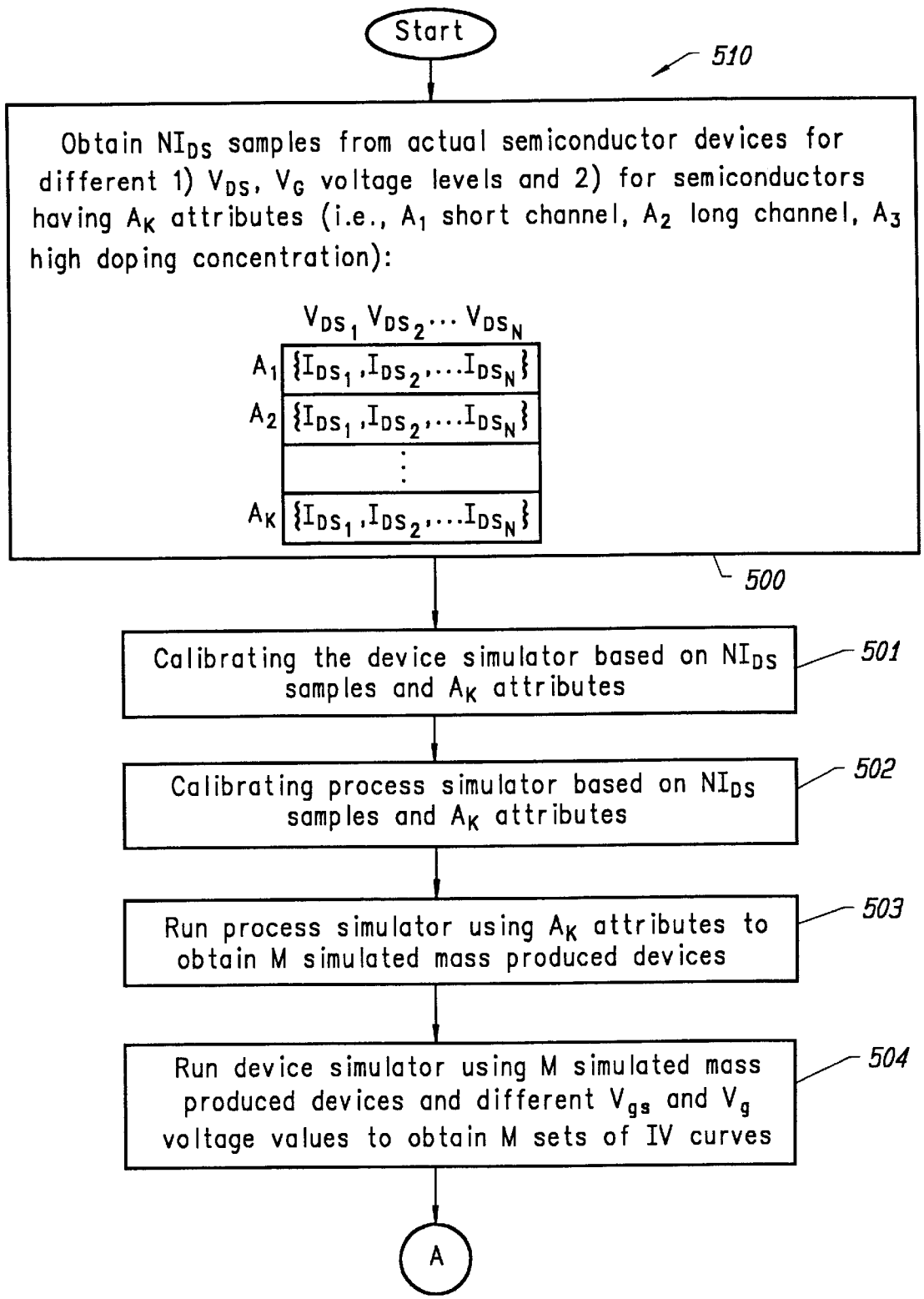
FIGS. 5a–b illustrate a logic flow diagram for modeling a mass-produced semiconductor device according to the present invention.
Figure 5B:
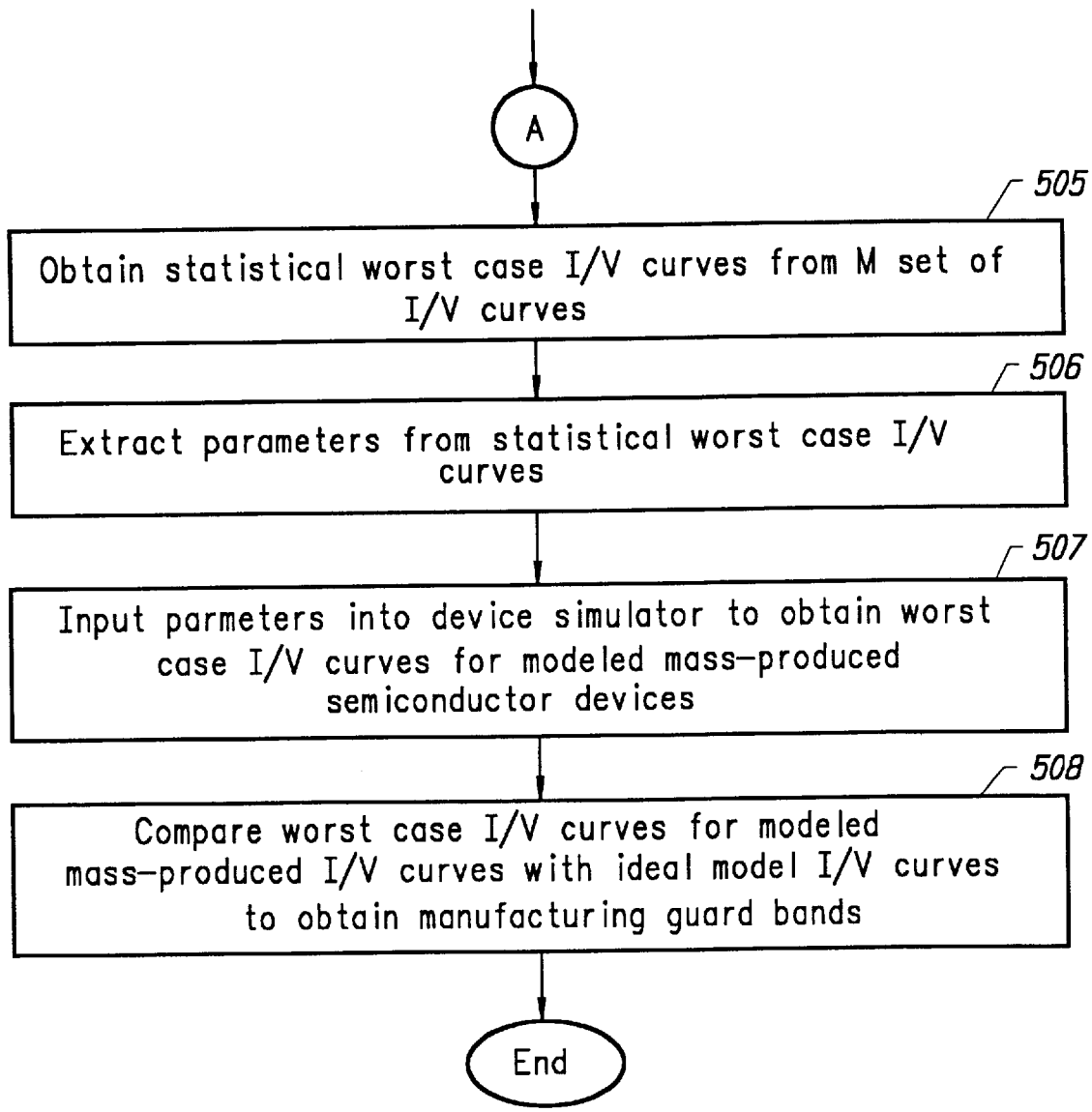

II. Method and Article of Manufacture for Simulating Mass-produced Semiconductor Device Behavior A method 510 for modeling a mass-produced semiconductor device is illustrated in FIGS. 5a–b. In an embodiment, method 510 is a mass-produced semiconductor device modeling software program which may be resident in interactive design computer 304 shown in FIG. 3. It should be understood that computer 304 may be programmed in accordance with well-known programming practices to automatically carry out most, if not all, of the steps of method 510. (One or more of the steps may be performed manually if desired.)

At step 500, N drain-to-source current values $I_{DS}$ are obtained from actual semiconductor devices based upon N drain-to-source voltage values $V_{DS}$ and gate voltage values $V_G$ for various semiconductor devices having different attributes $A_K$. For example, a sampled semiconductor device A, may have a long channel length, while another sampled semiconductor device $A_2$ may have a short channel length.

At step 501, a device simulator, such as BSIM3 device simulator obtained from the Department of Electrical Engineering and Computer Science, University of California, Berkeley, Calif. 94770, is calibrated using the N drain-to-source current values $I_{DS}$ and N drain-to-source voltage values $V_{DS}$. Other device simulators, such as PISCES and MINIMOS, may likewise be used.

A process simulator, such as a SUPREM IV simulator, available from Technology Modeling Associates of Palo Alto, Calif., is calibrated in step 502 based upon the N drain-to-source current values $I_{DS}$ and N drain-to-source voltage values $V_{DS}$ and measured attributes of the K semiconductor devices. In an embodiment, eight semiconductor devices having varying attributes, such as channel length and doping concentration, are used.

In step 503, M simulated mass-produced semiconductor devices are then generated from running a process simulator using the $A_K$ attributes used in step 500.

In step 504, the M simulated mass-produced devices having various attributes obtained in step 503 are then input into a device simulator to obtain M sets of I/V curves based upon varying drain-to-source voltage values $V_{DS}$ and gate voltage values $V_G$. At step 505, worst-case I/V curves from the M set of I/V curves is obtained by averaging the drain-to-source current values $I_{DS}$ associated with respective drain-to-source voltage values $V_{DS}$. Parameters for a device simulator are extracted from the statistical worst-case I/V curves in step 506. A device parameter extractor and parameter software is used to obtain parameters from the statistical worst-case I/V curves.

A device simulator outputs worst-case I/V curves in step 507 in response to input parameters obtained from the statistical I/V curves. Finally, worst-case I/V curves may be compared to an ideal I/V curve, including mean values of $I_{DS}$, to obtain manufacturing guard bands in step 508.

As described above, method 510 may be encoded in a software program stored in memory 304c in interactive design computer 304a, as illustrated in FIG. 3. In alternate embodiments, method 510 may be embodied in a software program stored on a computer readable medium, such as a magnetic or optical disk.

III. Fabrication Line Monitoring and Correction System

Figure 6B:
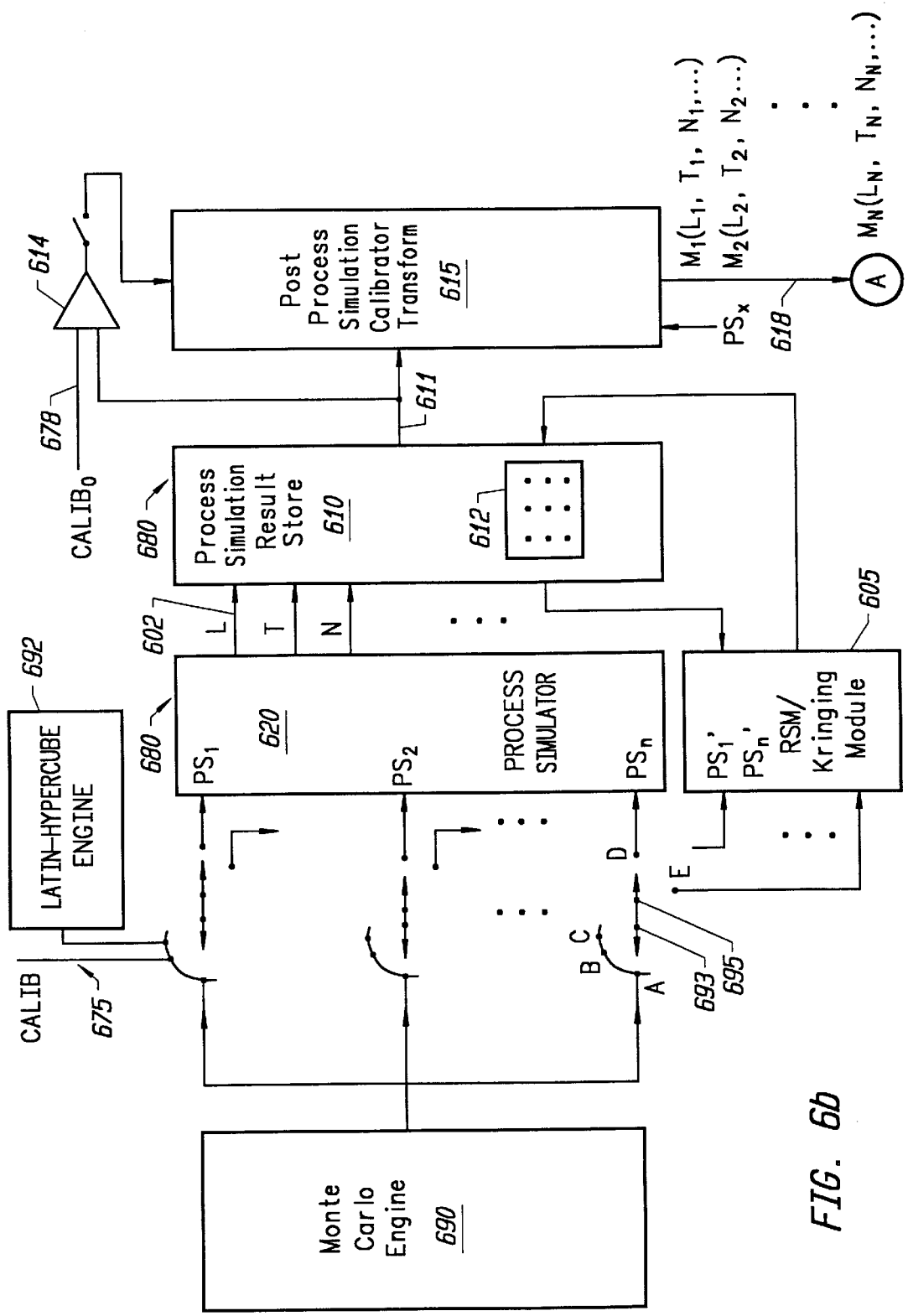

FIGS. 6a–b illustrates a fabrication line monitoring and correction system according to the present invention.

As seen in FIG. 6a, an input lot 601 of wafers is supplied to mass-processing line 602. The number of wafers in a lot 601 can vary, but is typically on the order of 20–25 wafers per lot (the number of wafers held by a wafer transport cassette). The circuit layouts for the production on each wafer of a given lot are typically all the same.

The wafers of each lot 601 are moved through the mass-processing line 602 one after the next. After one lot 601 is input, a next lot having the same circuit design (not shown) is input, and another, and so forth. Typically, a large number of lots will be processed at one time for each type of to-be-produced circuit (e.g., a memory device, or a microprocessor, or a programmable logic device).

The mass-processing line 602 is part of an overall wafer processing system referred to herein as 600. Processing line 602 includes: (1) a first station 602a for coating each wafer with material layers such as anti-reflection coating ("ARC") and photoresist ("PR") layers; (2) a second station 602b for exposing the material layers (the photoresist layer) to a radiation pattern; (3) a third station 602a for developing each exposed wafer; (4) a fourth station 602d for etching each developed wafer; and (5) a fifth station 602e for implant deposition for each wafer.

The output of processing line 602 is shown as post-doped implant wafer lot 605. After wafer lot 605 completes process line 602, two or more sample wafers from each post-doped wafer lot 605 are temporarily removed as indicated by dual lines 607. Semiconductor device attribute values, as well as drain-to-source current values $I_{DS}$, as a function of gate voltage values $V_G$ and drain-to-source voltage values $V_{DS}$ are measured. These values are input to mass-produced semiconductor device modeling system 670 on line 678.

The expert control unit 650 is coupled by way of control bus 655 to control the process parameters of one or more of the coating station 602a, the exposure station 602b, the development station 602c, the etch station 602d and the implant station 602e.

Expert controllable parameters of the coating station 602a may include the ARC layer thickness, the ARC refractive index (by choice of material) and the photoresist thickness. Controllable parameters of exposure unit 602b may include the mean focus depth, the exposure dosage, the partial coherence of the exposure radiation, the numeric aperture of the stepper optics and the phase shift angles of the mask. Controllable parameters of the developing station 602e may include the development time, development temperature and diffusion length (by choice of the photoresist material and development materials). Controllable parameters of the etch station 602d may include chamber pressure, flow rate, temperature, field intensity, and etch time. Controllable parameters of the dopant implant station 602c may include dopant type, dopant concentrations and energy level.

The control decisions of the expert control unit 650 are predicated on a computer-implemented mass-produced semiconductor modeling system 670 to which the expert control unit 650 is coupled by way of interface 675.

The modeling system 670 includes a semiconductor process simulator 620 that predicts the behavior of the processing line 602 (based on actually obtained semiconductor attribute measurements on line 678) and a semiconductor device simulator 640 that predicts the behavior of a semiconductor device manufactured on processing line 602.

The interface 675 between the expert control unit 650 and the process modeling system 670 carries both control signals for mediating the model creation operation and also consultation input/output data that lets the expert control unit 650 pose various queries to the process modeling system 670.

Connection 678 is used during the process and device simulator operation to calibrate the output data of the process simulator 620 and device simulator 640 to actual data held within the sample-and-store unit 610.

The expert control unit 650 may be implemented as a computer having a central or distributed processing unit and appropriately programmed memory. The modeling system 670 may also be implemented as part of the same computer system or may be implemented as separate hardware. The previously described sample-and-store unit 610 may be similarly implemented as separate hardware or incorporated into the computer system that includes the expert control unit 650.

Referring to FIG. 6b, the process modeling system 670 includes a process simulator 620 such as the DEPICT™ photolithography simulator available from Technology Modeling Associates of Palo Alto, Calif. Other process simulators, of course, may be used in its place. Likewise, modeling system 670 includes a device simulator 610 such as BSIM3 device simulator available from the Department of Electrical Engineering and Computer Science, University of California, Berkeley, Calif. 94770.

Process simulator 620 receives a plurality of process parameter sample signals, $PS_1$ through $PS_n$. Signals $PS_1$–$PS_n$ represent process parameters present for the process simulated in process simulator 620 at a given instant of time. The process simulator 620 responsively outputs signals 602 representing critical process result values such as L (channel length), T (gate oxide thickness) and N (doping concentration) in the simulated manufactured semiconductor device.

Process simulation result data 602 is stored in a process simulation result storing memory 610. The process simulation result storing memory 610 includes a Latin Hypercube driven region 612 whose function will be described later.

The output 611 of memory 610 drives a post-simulation calibration-transform module 615. Once calibrated, the calibration-transform module 615 operates according to multivariate correction equations to calibrate the process simulation results (which are typically in terms of normalized values) so they correspond with actual values held in the sample-and-store unit 610 of FIG. 6a.

The calibration transform parameters of the calibration-transform module 615 are set by a calibrating comparator 614 during a calibration mode. As will be later explained, the calibration-transform module 615 is preferably made responsive not only to the stored simulation results on output 611 but also to one or more of the applied process parameter signals, $PS_1$ through $PS_n$ ($PS_x$).

The output 618 of the calibration-transform module 615 provides a plurality of predicted semiconductor devices $M_N$ having semiconductor attributes (L, T, N . . . ) determined by process simulator 620.

The inputs of the process simulator 620 may be driven from a number of sources.

A plurality of n routing switches 693 are provided for supplying process parameter samples ($PS_1$, $PS_2$ . . . $PS_N$) from at least three different sources: (a) a calibration-mode real input 675; (b) a Monte Carlo engine 690 and (c) a Latin Hypercube engine 692.

In the case where the process parameter selecting switches 693 are in a first position (A) and the illustrated following group of n bypass switches 695 are in a direct-connect position (D), the noisy process parameters produced by Monte Carlo engine 690 are routed to process simulator 620. Process simulator 620 then evaluates the received inputs and generates corresponding predicted result values 602 which are stored in the result memory 610.

A large number of simulation runs are performed in order to store a statistically significant number of results in the result storage memory 610. The number of simulated runs is preferably on the order of 100 to 200, more preferably on the order of 400 runs, and even more preferably on the order of 800 or more runs.

Each run of the process simulator 620 takes a relatively long amount of time. It takes a corresponding multiple of that one-run time to perform the desired 100 to 800+ large number of noise-infected simulations.

If desired, the illustrated Monte Carlo engine 690 may be replaced with a Latin Hypercube sampling system that generates an essentially equivalent statistical pattern of noise-infected process parameter values ($PS_1$, $PS_2$ . . . $PS_N$) generated by Monte Carlo engine 690. In such a case, the number of Latin Hypercube sampling runs can be a smaller number to assure that a statistically meaningful result is obtained from the corresponding set of noisy simulations.

The time for gathering simulated result samples may be significantly reduced by bypassing the process simulator 620 and instead using a response surface modeler (RSM) in combination with a kriging error-correction interpolator. The combination of the RSM and kriging interpolator is referenced as block 605 in FIG. 6b. A neural net modeler could be used in place of the RSM/kriging module 605 if desired and trained to produce similar results.

To program the RSM portion of module 605, the parameter selecting switches 693 are first set to drive position (C). A Latin Hypercube engine 692 or its equivalent then supplies a regular matrix of process parameter samples over time for filling in a corresponding result region 612 in the result storing memory 610. In one particular embodiment, the Latin Hypercube engine 692 was designed to provides 51 runs through the process simulator 600 in order to produce the pre-simulated data of result region 612.

The response surface modeler (RSM) then scans result region 612 and develops a surface model for the data contained in that region 612. Error between the modeled surface and the actual data contained in region 612 is corrected by the kriging interpolator.

Next, the parameter source selecting switches 693 are reset to position (A) and the bypass switches 695 are set to bypass position (E). The larger number (e.g., 800 or so) of noisy Monte Carlo simulation runs are processed through the RSM/ kriging module 605 rather than through the process simulator 600. In another embodiment, a smaller number of Latin Hypercube samples may be used to replace the Monte Carlo samples. Results are produced much faster for storage in simulation result storing memory 610. This means that more queries can be processed in a given time period. The overhead for this performance gain is the 51 or so additional runs for generating mapping region 612 with the Latin Hypercube engine 692.

In order to calibrate the post-simulation transform module 615, the parameter source selecting switches 693 are thrown into calibration position (B). Accurately measured process parameters from the real processing line 602 are fed in through connection 675 and the actually-observed results are supplied through calibration output feed 678 (from the sample and store memory 610 of FIG. 6a). Comparator 614 is activated and operates to find the transform parameters that minimize the error between the actual results on line 678 and the simulated results on line 611. Any one of a number of calibration and correction transforms may be used including a linear least-squares method.

Figure 6C:
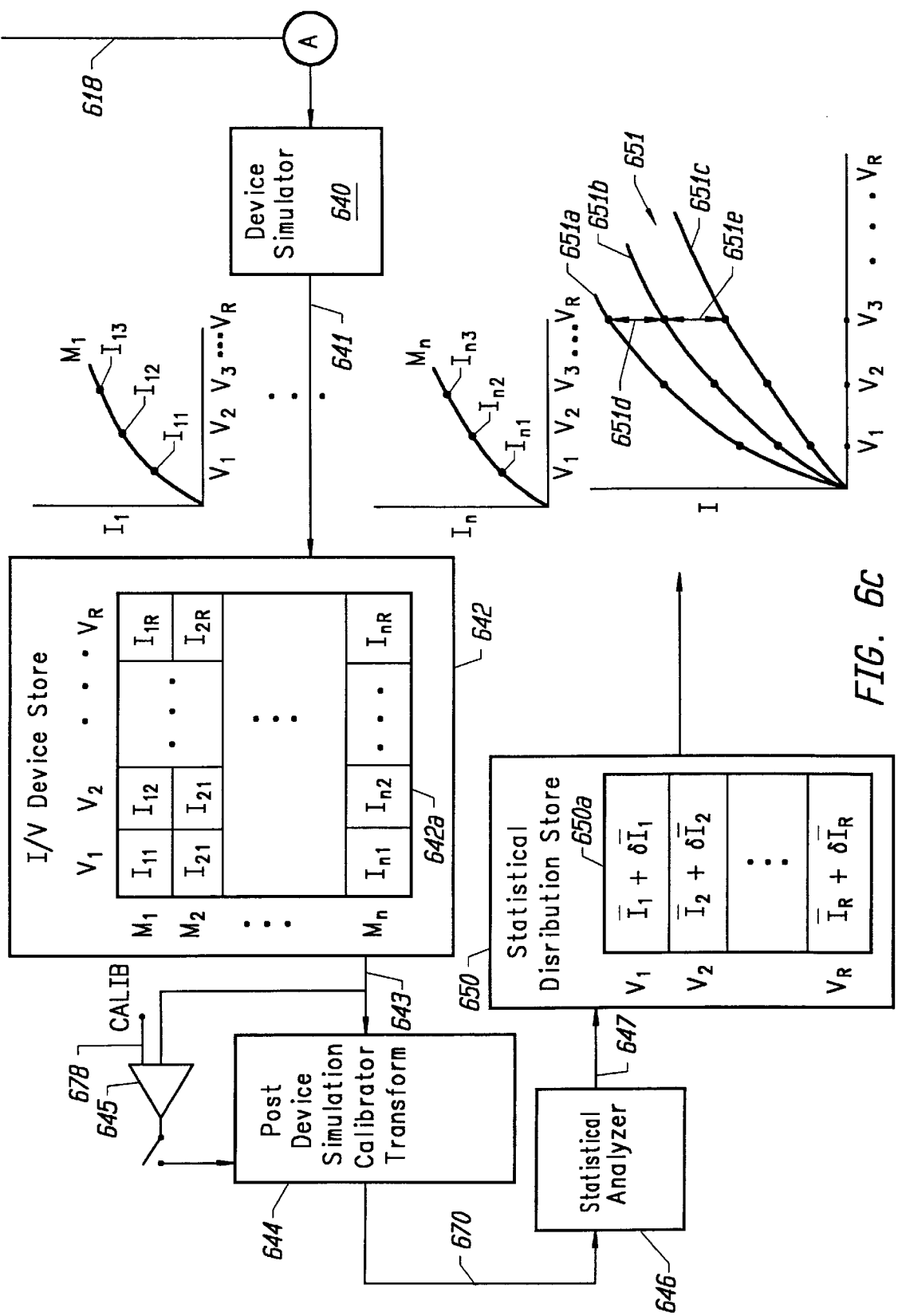
Figure 7A:
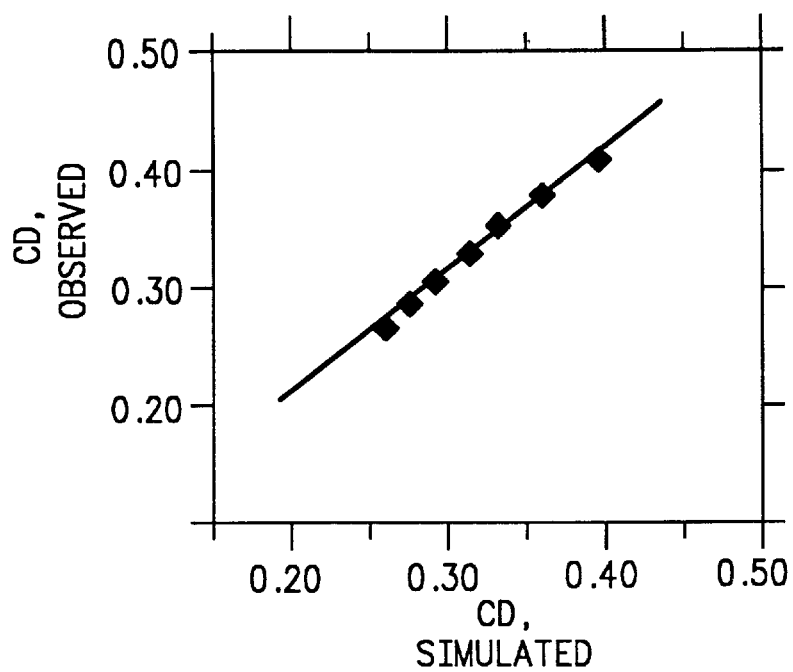
FIGS. 7a–c illustrate a process and device calibration transform, respectively, according to the present invention.
Figure 7B:
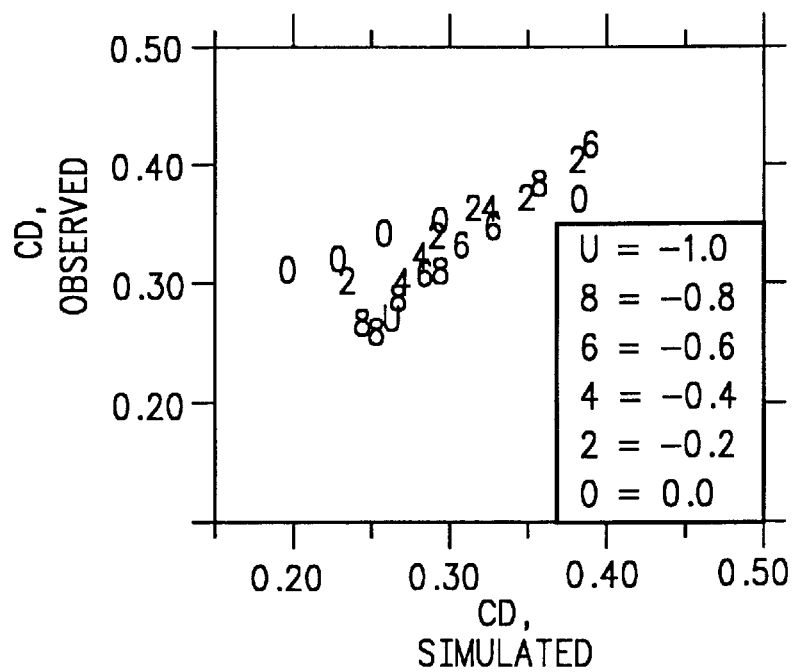
Figure 7C:
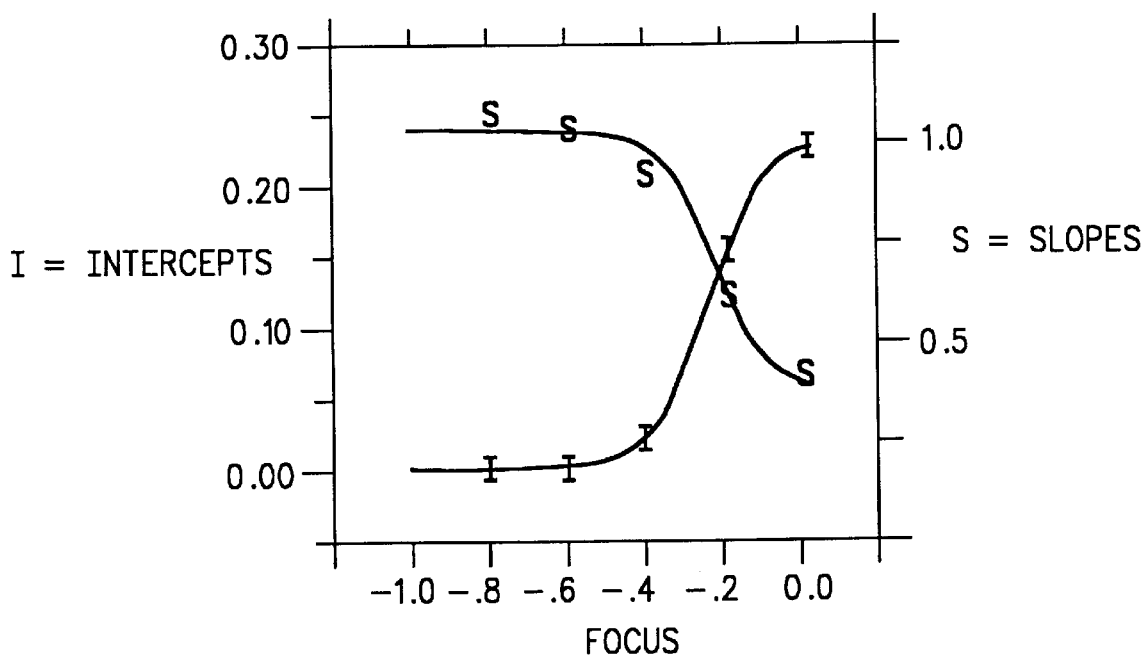

Examples of a linear calibration transform is shown in FIGS. 7a–c. FIG. 7a shows the calibration results for densely-packed 0.35μ lines on a silicon wafer while the focus of a stepper remains fixed at −0.6 microns. Note that the result is fairly linear. FIG. 7b illustrates how the slope of the linear approximations change as the mean focus parameter changes. Finally, FIG. 7c illustrates the slope and intercept values for a linear transform as a function of stepper focus. To provide a generic post-simulation calibration for all values of focus, it is preferable to connect transform module 615 to also receive the focus parameter $PS_{focus}$ ($PS_x$) from the input to switch set 695 so that the corrections illustrated in FIG. 6b and 6c can be automatically carried out by module 615 for any value of focus.

The M simulated mass-produced semiconductors having attributes L, T, N and so on are then input into device simulator 640 on line 618. Device simulator 640 then outputs a plurality of M I/V curves corresponding to the M simulated mass-produced semiconductor devices, as shown in FIG. 6c. For example, a first simulated mass-produced semiconductor device M, has an I/V curve, in particular drain-to-source current values $I_{11}, I_{12}, I_{13}$ corresponding to drain-to-source voltage values $V_1, V_2, V_3 \ldots V_R$. Likewise, semiconductor device $M_n$ has corresponding drain-to-source current values $In_1, In_2, In_3 \ldots$ stored in I/V device store 642. In particular, a table 642a, consisting of n rows of simulated mass semiconductor devices and R columns of corresponding drain-to-source voltage values is built.

These drain-to-source current values are then output on line 643 to post device simulated calibrator transform 644 and to comparator 645. Post device simulation calibrator transform 644 and comparator 645 operate similarly to post process simulation calibrator transform 615 and comparator 614 as shown in FIG. 6b. Actual drain-to-source current values corresponding to the voltage values $V_1, V_2, V_3 \ldots V_R$ are input on line 678 to comparator 645.

Comparator 645 is activated and operates to find the transform value that minimize the error between the actual current results on line 678 and the simulated current values on line 643. As with transform 615, any one of a number of calibration and correction transforms may be used including a linear least-squares method. The simulated current values stored in I/V device store 642 then may be calibrated by transform 644.

The calibrated current values are then output on line 670 to statistical analyzer 646. Statistical analyzer 646 creates a mean $\bar{I}_R$ and standard deviation $\sigma I_R$ associated with each of the drain-to-source voltage values $V_1, V_2, V_3 \ldots V_R$ and outputs the results on line 647 to statistical distribution store 650. Statistical distribution store 650 includes a Table 650a having corresponding mean $\bar{I}_R$ and standard deviation current values $\sigma I_R$ corresponding to the R drain-to-source voltage values. In an alternate embodiment, a smallest (or 2nd smallest) and largest (or 2nd largest) current maximum could be used for statistical guard bands. Based upon the mean current and standard deviation values in Table 650a, worst-case I/V curves 651a and 651c may be constructed along with an idealized I/V curve 651b. Manufacturing guard bands 651d and 651e then may be determined based upon the difference between idealized I/V curve 651b (consisting of mean $\bar{I}_R$ values) and worst-case curves 651a and 651c. The curves 651a and 651c consist of positive and negative 3 $\sigma \bar{I}_R$ values. Moreover, probabilities may be assigned to various curves constructed within the worst-case curves to identify manufactured guard bands. A parameter extractor device and software then may be used to obtain parameters associated with curves 651, 651a and 651c.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

We claim:

1. A design apparatus for modeling a mass-produced semiconductor device, comprising:

a display for displaying data to a user;

input means for supplying input data in response to a user's input;

memory, coupled to the display and the input means, for storing a computer software program; and, a processor, coupled to the display, the input means and the memory, for controlling the memory, the input means, and the display in response to a stored computer software program and input data to perform data processing operations;

wherein the stored software program includes, (a) means for providing a plurality of simulated mass-produced semiconductor devices responsive to a plurality of process parameters wherein the plurality of simulated semiconductor devices have associated attributes;

(b) means for providing a plurality of semiconductor device behaviors responsive to the plurality of simulated mass-produced semiconductor devices and actual semiconductor device behaviors, respectively;

(c) means for calibrating the means for providing a plurality of semiconductor device behaviors; and (d) means for obtaining a worst-case semiconductor device behavior responsive to the plurality of semiconductor behaviors.

2. The design apparatus of claim 1, wherein the semiconductor device behaviors include drain-to-source current and drain-to-source voltage values.

3. The design apparatus of claim 1, wherein the semiconductor device attributes includes channel length.

4. The design apparatus of claim 1, wherein the means for providing a plurality of semiconductor device behaviors include a device simulator.

5. The design apparatus of claim 1, wherein the means for providing a plurality of mass-produced simulated semiconductor devices includes a process simulator.

6. The design apparatus of claim 1 wherein the input data includes process parameters, actual semiconductor behaviors and actual semiconductor attributes.

7. The design apparatus of claim 1, wherein the stored software program further includes means for providing process parameters.

8. The design apparatus of claim 7, wherein the means for providing process parameters include a Monte Carlo engine.

9. The design apparatus of claim 7, wherein the means for providing process parameters includes a Latin Hypercube engine.

10. The article of manufacture of claim 9, further including:

(f) computer readable program means for extracting a plurality of parameters from the worst-case I/V curves.

11. The article of manufacture of claim 9, further including:

(f) computer readable program code means for generating the plurality of process parameters.

12. The article of manufacture of claim 9, wherein the computer readable program means for obtaining worst-case I/V curves includes means for obtaining an average drain-to-source current value associated with a predetermined drain-to-source voltage value.

13. The article of manufacture of claim 9, wherein the computer readable program means for obtaining worst-case I/V curves includes means for obtaining a maximum drain-to-source current value associated with a predetermined drain-to-source voltage value.

14. An article of manufacture, including computer readable medium having computer readable program code means embodied therein for modeling a mass-produced semiconductor device, comprising:
   (a) computer readable program code means for simulating a plurality of mass-produced semiconductor devices responsive to a plurality of process parameters, when the plurality of simulated mass-produced semiconductor devices have associated semiconductor device attributes;
   (b) computer readable program code means for calibrating the computer readable means for simulating a plurality of mass-produced semiconductors in response to actual semiconductor device attributes;
   (c) computer readable program code means for simulating a plurality of semiconductor device I/V curves in response to the semiconductor device attributes of the respective plurality of simulated mass-produced semiconductor devices;
   (d) computer readable program code means for calibrating the means for simulating a plurality of semiconductor device I/V curves in response to actual in the plurality of semiconductor device I/V curves.
   (e) computer readable program means for obtaining worst-case I/V curves in the plurality of semiconductor device I/V curves.

15. The article of manufacture of claim 14, wherein the article of manufacture is a magnetic disk.

16. The article of manufacture of claim 14, wherein the article of manufacture is an optical disk.

17. A method for predicting drain-to-source current versus drain-to-source voltage curves for a mass-produced semiconductor device, having a channel length and/or other fabrication-defined attributes, the mass-produced semiconductor device having a corresponding sample semiconductor device having a gate, source and drain, the method comprising the steps of:
   (a) simulating the process of manufacturing the mass-produced semiconductor device, responsive to a plurality of process parameters, to obtain a plurality of simulated semiconductor devices having associated fabrication-defined attributes;
   (b) simulating a plurality of semiconductor drain-to-source current versus drain-to-source voltage curves, responsive to associated fabrication defined attributes associated with respective simulated semiconductor devices in the plurality of simulated semiconductor devices;
   (c) obtaining worst-case drain-to-source current versus drain-to-source voltage curves for the mass-produced semiconductor device based on the plurality of simulated semiconductor drain-to-source current versus drain-to-source voltage curves;
   (d) extracting parameters from the worst-case drain-to-source current versus drain-to-source voltage curves; and,
   (e) inputting the parameters into a device simulator to obtain mass-produced semiconductor device worst-case fabrication-defined attributes.

18. The method of claim 17, further including the steps of:
   (f) generating the plurality of process parameters by a Latin-Hypercube engine.

19. The method of claim 17, further including the steps of:
   (f) generating the plurality of process parameters by a Monte Carlo engine.

20. The method of claim 17, further including the steps of:
   (f) generating the plurality of process parameters by an RSM/kriging engine.

21. The method of claim 17, wherein the step of obtaining worst-case drain-to-source current versus drain-to-source voltage curves includes the step of:
   (a) averaging drain-to-source current values associated with a predetermined drain-to-source voltage value.

22. The method of claim 17, wherein the step of obtaining worst-case drain-to-source current versus drain-to-source voltage curves includes the step of:
   (a) obtaining a maximum drain-to-source current value associated with a predetermined drain-to-source voltage value.

23. The method of claim 17, wherein the step of obtaining worst-case drain-to-source current versus drain-to-source voltage curves includes the step of:
   (a) obtaining a standard deviation drain-to-source current value associated with a predetermined drain-to-source voltage value.

24. A wafer fabrication and line monitoring system, comprising:
   (a) a mass-production line for processing a wafer having a semiconductor device;
   (b) a sample and measure device for 1) sampling process wafers through the mass-production line and for 2) measuring and storing semiconductor attributes and behavior;
   (c) a process simulator for outputting a plurality of simulated mass-produced semiconductor devices having associated attributes responsive to a plurality of simulated process parameters;
   (d) a device simulator for outputting a plurality of respective I/V curves responsive to the plurality of simulated semiconductor device attributes;
   (e) a statistical analyzer for identifying worst-case I/V curves in the plurality of I/V curves; and,
   (f) an expert controller, coupled to the statistical analyzer and mass production line, for responsively adjusting the settings of process parameters and/or the tolerance allowances of the process parameters within the worst-case I/V curves.

25. The wafer processing system of claim 24, wherein the mass-production line includes a stepper and a development station.

26. The wafer processing system of claim 24, wherein the process simulator is calibrated based on the measured semiconductor attributes.

27. The wafer processing system of claim 24, wherein the device simulator is calibrated based on measured semiconductor behavior.

28. The wafer processing system of claim 24, further including:
   a Monte Carlo engine for generating the plurality of simulated process parameters.

29. The wafer processing system of claim 24, further including:

a Latin Hypercube engine for generating the plurality of simulated process parameters.

30. The wafer processing system of claim 24, further including:
an RSM/kriging engine for generating the plurality of simulated process parameters.

31. The wafer processing system of claim 24, wherein the statistical analyzer averages a plurality of drain-to-source current values associated with a predetermined drain-to-source voltage value.

32. The wafer processing system of claim 24, wherein the statistical analyzer obtains a maximum drain-to-source current value associated with a predetermined drain-to-source voltage value.

33. The wafer processing system of claim 24, wherein the statistical analyzer obtains a standard deviation drain-to-source current value associated with a predetermined drain-to-source voltage value.

34. A method for modeling a mass-produced semiconductor device, comprising the steps of:
(a) obtaining a plurality of simulated mass-produced semiconductor devices having a plurality of attributes responsive to a plurality of process parameters;
(b) obtaining a plurality of simulated mass-produced semiconductor device behaviors responsive to the plurality of simulated mass-produced semiconductor devices;
(c) obtaining a worst-case semiconductor device behavior in the plurality of simulated mass-produced semiconductor device behaviors;
(d) extracting device parameters from the worst-case semiconductor device behavior; and,
(e) obtaining a worst-case mass-produced semiconductor device behavior responsive to the device parameters.

35. The method of claim 34, wherein the obtaining a plurality of simulated mass-produced semiconductor devices is performed by a process simulator and the step of obtaining a plurality of simulated mass-produced semiconductor device behaviors is performed by a device simulator.

36. The method of claim 35, wherein the process simulator and device simulator are calibrated by actual semiconductor device measurements.

37. The method of claim 34, further comprising the step of comparing the worst-case mass-produced semiconductor device behavior with an ideal semiconductor device behavior to obtain a manufacturing guard band.

* * * * *